United States Patent
Prokofiev

(10) Patent No.: US 7,235,880 B2
(45) Date of Patent: Jun. 26, 2007

(54) IC PACKAGE WITH POWER AND SIGNAL LINES ON OPPOSING SIDES

(75) Inventor: Victor Prokofiev, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 225 days.

(21) Appl. No.: 10/931,917

(22) Filed: Sep. 1, 2004

(65) Prior Publication Data
US 2006/0043581 A1 Mar. 2, 2006

(51) Int. Cl.
H01L 23/48 (2006.01)
H01L 23/52 (2006.01)
H01L 29/40 (2006.01)
H01L 23/02 (2006.01)
H01L 23/34 (2006.01)

(52) U.S. Cl. ............... 257/734; 257/678; 257/712; 257/713; 257/717; 257/720; 257/737; 257/738

(58) Field of Classification Search ......... 257/678, 257/738, 712–713, 717, 720, 734, 737
See application file for complete search history.

(56) References Cited

U.S. PATENT DOCUMENTS

| | | | | |
|---|---|---|---|---|
| 5,359,208 | A * | 10/1994 | Katsuki et al. | 257/82 |
| 5,623,394 | A * | 4/1997 | Sherif et al. | 361/705 |
| 5,805,427 | A * | 9/1998 | Hoffman | 361/770 |
| 5,952,719 | A * | 9/1999 | Robinson et al. | 257/737 |
| 6,084,297 | A * | 7/2000 | Brooks et al. | 257/698 |
| 6,225,695 | B1 * | 5/2001 | Chia et al. | 257/712 |
| 6,497,583 | B1 | 12/2002 | Weiss et al. | |
| 6,533,613 | B1 | 3/2003 | Turner et al. | |
| 6,680,526 | B2 | 1/2004 | Figueroa et al. | |
| 6,703,697 | B2 | 3/2004 | Leahy et al. | |
| 6,706,562 | B2 | 3/2004 | Mahajan et al. | |
| 6,747,362 | B2 | 6/2004 | Barrow | |
| 6,750,536 | B2 | 6/2004 | Stewart | |
| 6,751,099 | B2 | 6/2004 | Vrtis et al. | |
| 6,752,635 | B1 | 6/2004 | Searls et al. | |
| 6,845,013 | B2 * | 1/2005 | Hartke et al. | 361/704 |
| 6,853,068 | B1 * | 2/2005 | Djekic | 257/706 |
| 6,979,784 | B1 * | 12/2005 | Duley | 174/260 |
| 7,030,482 | B2 * | 4/2006 | Haines | 257/706 |
| 7,038,316 | B2 * | 5/2006 | Hu et al. | 257/738 |
| 7,091,586 | B2 * | 8/2006 | Millik et al. | 257/685 |
| 7,117,114 | B2 * | 10/2006 | Arabi et al. | 702/132 |
| 2002/0063327 | A1 * | 5/2002 | Chu et al. | 257/706 |
| 2003/0042618 | A1 * | 3/2003 | Nose et al. | 257/778 |
| 2004/0027802 | A1 * | 2/2004 | Duerbaum et al. | 361/688 |
| 2004/0113239 | A1 | 6/2004 | Prokofiev et al. | |
| 2004/0169998 | A1 * | 9/2004 | Vrtis et al. | 361/705 |
| 2005/0006739 | A1 * | 1/2005 | Howard et al. | 257/678 |

(Continued)

*Primary Examiner*—Ida M. Soward
(74) *Attorney, Agent, or Firm*—Blakely, Sokoloff, Taylor & Zafman LLP

(57) ABSTRACT

A package for integrated circuits is described. The package has a package substrate with a land side and an opposite die side, a first set of low level signal connectors on the die side to connect to an IC to be carried by the package, and a second set of low level signal connectors on the die side to connect to external components. The package may have power connectors on the land side or a power supply attached to the land side. A heat spreader or cooler may be attached to the die side.

22 Claims, 4 Drawing Sheets

U.S. PATENT DOCUMENTS

| | | | |
|---|---|---|---|
| 2005/0035436 A1* | 2/2005 | Novak et al. | 257/678 |
| 2005/0051889 A1* | 3/2005 | Wood et al. | 257/712 |
| 2006/0014444 A1* | 1/2006 | Searls et al. | 439/894 |
| 2006/0027921 A1* | 2/2006 | Chiu et al. | 257/738 |

* cited by examiner

IC PACKAGE WITH POWER AND SIGNAL LINES ON OPPOSING SIDES

BACKGROUND

1. Field

The present description relates to integrated circuit packaging, and more particularly, to the placement of external connections on an integrated circuit package.

2. Background

IC's (Integrated Circuits) are manufactured in and on semiconductor wafers with several layers of active circuitry. The wafer is cut into separate semiconductor chips or dies which are mounted to and electrically coupled to package substrates. The substrates and dies are sealed inside a package for which the substrate is said to be on the land side of the package and the chip or die is said to be on the die side of the package. Pins, balls or lands for the ground plane, power plane and low level signaling extend from the package to allow the package to be coupled to a PCB (Printed Circuit Board), PWB (Printed Wiring Board), or a socket. Many packages also have a heat transfer plate or some other heat conducting structure to connect to a cooling device such as heat fins, heat pipes, liquid radiators, etc.

Typically, all of the package connections for ground, power, and signaling are placed on the land side of the package and extend directly from the package substrate. For more complex chips, this requires that the connectors be very close together and that the high level power connectors be placed close to low level signal connectors. The die side typically has no connections except for cooling connections. For example, the die side of the package may carry a finned heat sink. For higher power chips, a fan with power and control connectors may also be mounted to the die side of the package.

The die operates best with a clean power supply and reference voltage, for example a uniform voltage level and minimal noise. The power delivery path from a power supply such as a VRM (Voltage Regulator Module) to the die, however, has an inductance associated with it, creating impedance in the power delivery system. During core switching, when a portion of the microprocessor is powered up or powered down, a large amount of current is drawn by the die and the current change causes a large voltage drop at the die due to the inductance in the power delivery path. These voltage drops may be mitigated using decoupling capacitors, but the capacitors add complexity and expense to the system design. Some systems use bulk capacitors, die side capacitors, and on-die (or embedded chip) capacitors. Land side capacitors are also used in some systems.

In addition, the trend in processor design is to operate at lower voltages (1 volt or less) but higher power, this increases the necessary amperage (100 Amps or more). Higher current levels are more susceptible to impedance effects and voltage drops. High current levels also require more bulky and expensive connectors between the VRM and associated chip. High current levels also create interference or distortion in low level signaling connections.

BRIEF DESCRIPTION OF THE DRAWINGS

Embodiments of the present invention will be understood more fully from the detailed description given below and from the accompanying drawings of various embodiments of the invention. The drawings, however, should not be taken to be limiting, but are for explanation and understanding only.

DETAILED DESCRIPTION

Figure 1:
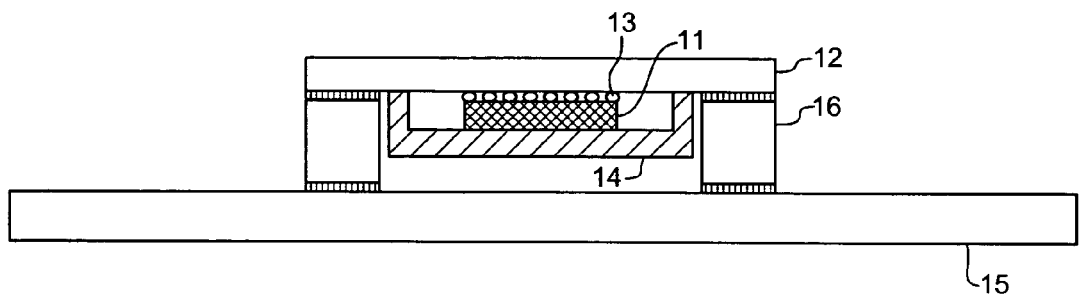
FIG. 1 is a cross-sectional diagram of an IC package according to a first embodiment of the invention.

FIG. 1 is a cross-sectional diagram of an IC (Integrated Circuit) package coupled to a PCB (Printed Circuit Board). The package has an IC, die, or chip 11 attached to a package substrate 12. The IC may be any of a variety of different types including a microprocessor, microcontroller, ASIC (Application Specific Integrated Circuit), FPGA (Field Programmable Gate Array), DSP (Digital Signal Processor), memory, I/O (Input/Output) controller or hub, etc. The substrate has data, control, and power interfaces 13 to the chip coupled to ground, power and signaling planes within the substrate. The substrate may be formed from any rigid dielectric substrate, such as a standard PC (printed circuit) board material, for example, FR-4 epoxy-glass, polyimide-glass, benzocyclobutene, Teflon, other epoxy resins, injection molded plastic or the like or ceramic. In one embodiment, the substrate is about 40 mils (1.0 mm) thick although it may be thicker or thinner, in other embodiments. The die is coupled to the substrate using a set of connectors 13, such as C4 (Controlled Collapse Chip Connect) bumps or any other type of electrical connection system.

The package includes a cover 14 attached to the package substrate. The cover forms an internal enclosure for the die that is sealed against the external environment to protect the die. The cover may be hermetically sealed to the substrate or it may surround the substrate. In one embodiment, the cover is an IHS (Integrated Heat Spreader) glued to the package substrate and thermally coupled to the die to transfer heat from the die to the package exterior. However, other types of covers may also be used.

The package substrate 12 is coupled to a second substrate 15 which may be a motherboard, a daughtercard, a cartridge substrate, a flexboard or any other substrate which may carry the package. In one embodiment, the second substrate is a conventional PCB, PWB (Printed Wiring Board) or a socket mounted to such a board. The die side of the package substrate is mounted to the second substrate using a set of connectors 16. These connectors may include power, ground and signaling connectors or a subset of such connectors. The connectors may be implemented using any of a variety of different technologies including BGA (ball grid array), SMT (Surface Mount Technology), LGA (Land Grid Array) or any of a variety of solder reflow technologies.

As shown in FIG. 1, the PCB 15 is spaced apart from the package substrate 12. This allows room to accommodate the package cover and die. The spacing may be accomplished using a PCB material with vias to accommodate connectors between the package substrate and the main PCB. The spacing may be accomplished by designing an appropriate socket. Alternatively, the connectors may provide the spacing. Elastomeric materials may be used between the package substrate and the PCB with conductive columns through the elastomeric material to carry the connections. Connector pins and receptacles may be used for the connections designed so that the pins are long enough to provide the spacing. The electrical connection and the physical spacing may be provided by the same structure as shown in FIG. 1 or by different structures.

In the example of FIG. 1, power may be supplied to the die either through the die side connectors or through other connectors. For example, low level data signals may be communicated on the die side connectors while power is provided through land side connectors (not shown). Alternatively all connections may be made through the die side connectors.

As can be seen in FIG. 1, the package substrate 12 couples the die 11 to the PCB or socket 15. Since the die connectors 13 and the package connectors 16 are on the same side of the substrate, the die side, the interconnections between the connectors do not have to penetrate through the entire thickness of the die. This allows the package substrate to be formed from a relatively thick material. A thick package substrate may be lower cost, better insulating and more durable than a thinner substrate. For the die side connectors shown in FIG. 1, microtraces or laser drilled vias of 30–40 μm or less may be used to interconnect the connectors.

Figure 2:
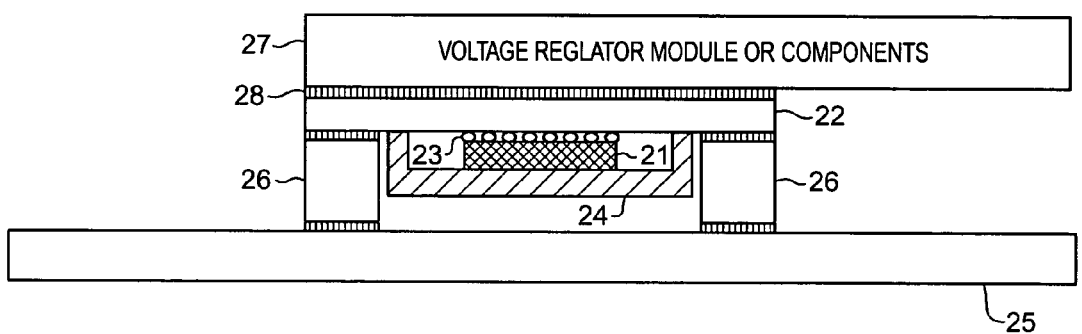
FIG. 2 is a cross-sectional diagram of an IC package according to a second embodiment of the invention.

FIG. 2 is a cross-sectional diagram of an alternative IC package coupled to a PCB. The package has an IC, die or chip 21 attached to a package substrate 22 using a set of connectors 23, such as C4 (Controlled Collapse Chip Connect) bumps similar to the diagram of FIG. 1. The package includes a cover 24 to seal the die and protect it from the external environment.

The package substrate 22 is coupled on its die side to a second substrate 25 such as a PCB using a set of connectors 26. These connectors are low level signaling connectors coupled to the die through shallows vias or microtraces as described above with respect to FIG. 1.

The land side of the package is coupled to a power supply 27 through a set of power connectors 28. The power connectors extend through the package substrate 22 to couple the die 21 directly to the power supply 27. These interconnections penetrate through the entire thickness of the die through drilled vias that may be 800 μm deep or more. This path is considerably shorter than a path across the PCB 25 to a power supply mounted adjacent the package. As a result, the path parasitics are greatly reduced. This reduces or eliminates any need for decoupling capacitors. The VRM may include capacitance in its voltage outputs that is sufficient for reliable chip operation. In addition, by providing power on one side of the package and low level signaling on the opposite side of the package, distortion, interference, and cross talk in the low level signaling is reduced.

The power supply may include a connector (not shown) to couple the power supply to a main or primary power supply. In one embodiment, the power supply is a VRM that receives a 12 volt supply from a main power supply and converts it to multiple 1.4 volt supplies each to supply a different core of the chip. A single chip may have a single voltage input with Vcc, Vss, and ground or it may have six or more cores each requiring the same or different voltages. Because the VRM is coupled directly to the package it may be designed specifically for the particular chip inside. The VRM may be fastened to the package so that when the package is replaced with another package, the VRM is also replaced in the same operation. Alternatively, instead of the power supply 27 shown, a coupling interface may be used to couple the connectors 28 to a power supply located near the package.

The power connectors 28 may also include control lines to enable, disable and adjust each of the core voltages. Placing the VRM so close to the die allows the control lines to change power settings very quickly. This reduction in reaction times allows more precise control of the chip and also allows it to operate closer to its maximum speed and voltage.

As an alternative, the PCB 25 may have a recess or depression that is large enough to receive the package cover 24 or some portion of the package but not as deep as the PCB. By recessing the package into the opening, the die side connectors may be made much shorter. This reduces parasitics and simplifies the mounting process. The package may alternatively be mounted to a socket and not directly to the PCB. In this case, the socket may include a hole or a recess to receive the package cover (see e.g. FIG. 5). Any desired cooling connections may be accommodated by the socket or the PCB. So, for example, heat pipes or liquid tubing may extend through the socket to the IHS to carry heat to the outside of the socket for ambient or refrigerant cooling. Similar alternatives may be applied to the embodiment of FIG. 1.

Figure 3:
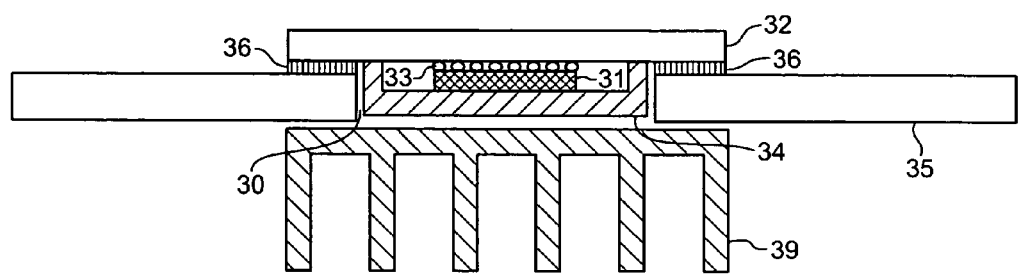
FIG. 3 is a cross-sectional diagram of an IC package according to a third embodiment of the invention.

FIG. 3 is a cross-sectional diagram of another alternative IC package coupled to a PCB. The package has an IC, die or chip 31 attached to a package substrate 32 using a set of connectors 33, such as C4 (Controlled Collapse Chip Connect) bumps similar to the diagram of FIG. 1. The package includes a cover 34, such as an IHS, to seal the die and protect it from the external environment. In the example of FIG. 3, the cover is thermally coupled to the die using, for example, a TIM (Thermal Interface Material) such as a metal or polymer solder. The cover may be plated or coated aluminum or copper or some other heat conductive material. One such cover is referred to as an IHS (Integrated Heat Spreader).

The package substrate 32 is coupled on its die side to a second substrate 35 such as a PCB using a set of connectors 36. These connectors may include power, ground and low level signaling connectors coupled to the die through planes or through shallow vias or microtraces as described above with respect to FIG. 1.

The example of FIG. 3 also includes a heat sink 39 thermally coupled to the package cover or IHS using, for example a TIM (Thermal Interface Material) or a spring connector. The heat sink has a set of pins or fins to present a large surface area to the ambient air outside the package. The heat sink may be augmented by a fan or some other cooler, such as heat pipes, liquid coolers, etc.

In contrast to the PCB of FIGS. 1 and 2, the PCB of FIG. 3 includes an opening 30 which is large enough to receive the package cover. In the example of FIG. 3, this hole 30 extends all the way through the PCB. It may take the form of a rectangular cut-out in the PCB material. Any connectors on the surface layer or other planes in the PCB may be routed around the hole. When the die side connectors are coupled to the PCB, the IHS 30 extends through the PCB.

By recessing the package into the opening, the die side connectors may be made much shorter. This reduces parasitics and simplifies the mounting process. If the package is mounted to a socket and not directly to the PCB, the socket may include a hole or a recess to allow a heat sink or other cooling device to be attached to the die side of the package, i.e. through the bottom of the socket (see e.g. FIG. 6). Any desired cooling connections may be accommodated by the socket, such as fins as shown, heat pipes or liquid tubing which all may extend through the socket to the IHS to carry heat to the outside of the socket for ambient or refrigerant cooling.

In the example of FIG. 3, the heat sink is attached to the IHS from the opposite side of the PCB. The IHS is almost as large as the opening in the PCB and the heat sink is substantially larger than the PCB, however, the relative sizes of these components may be adapted to suit different applications. From a position on the opposite side of the PCB, the heat sink may connect to a different ambient environment than that of the rest of the package. In a computer system embodiment, for example, the PCB may be a motherboard with sockets for memory and adapter cards on the same side as the microprocessor socket. The heat sink on the opposite side of the motherboard may be exposed to dedicated fans, may extend outside the computer case, or may be coupled to a portion of the computer system case or chassis.

Figure 4:
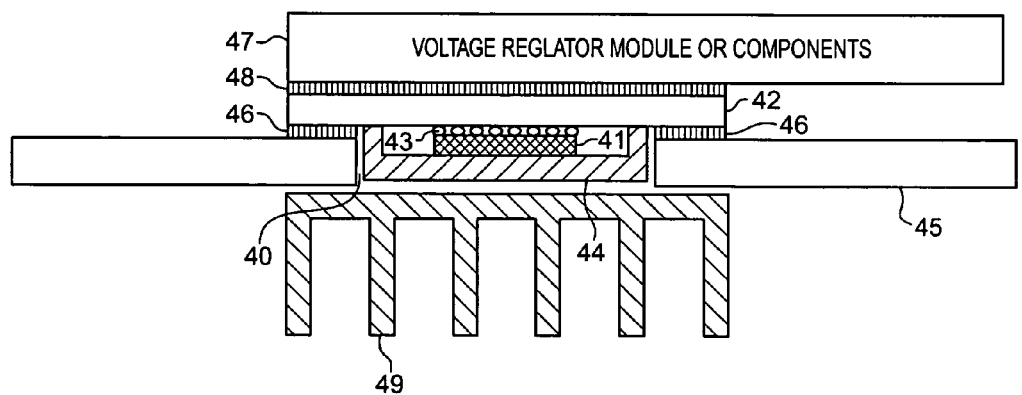
FIG. 4 is a cross-sectional diagram of an IC package according to a fourth embodiment of the invention.

FIG. 4 is a cross-sectional diagram of another alternative IC package coupled to a PCB. The package has an IC, die or chip 41 attached to a package substrate 42 using a set of connectors 43 similar to the diagram of FIG. 1. The package includes a cover 44, such as an IHS to seal the die and protect it from the external environment.

The package substrate 42 is coupled on its die side to a second substrate 45 such as a PCB using a set of connectors 46. These connectors are low level signaling connectors coupled to the die through shallows vias or microtraces as described above with respect to FIG. 2.

The land side of the package is coupled to a power supply 47 through a set of power connectors 48, similar to that described with respect to FIG. 2. The power connectors extend through the package substrate 42 to couple the die 41 directly to the power supply 47. As with the example of FIG. 2, the separation between the high current land side power lines and low current die side signal lines reduces the return and insertion loss for the signal lines and reduces cross talk between the power and the signal lines. The very short distance between the power supply and the die reduces voltage droops boosting efficiency and reducing heat.

The connected power supply also allows each package to be fitted with a power supply and any decoupling capacitors specifically adapted for the particular die. The combination of die, package, VRM, decoupling capacitors and heat sinks may be sold and shipped as a single unit. If a package is replaced, then the specific power supply and other components may be replaced in a single operation without replacing any other PCB components.

Figure 7:
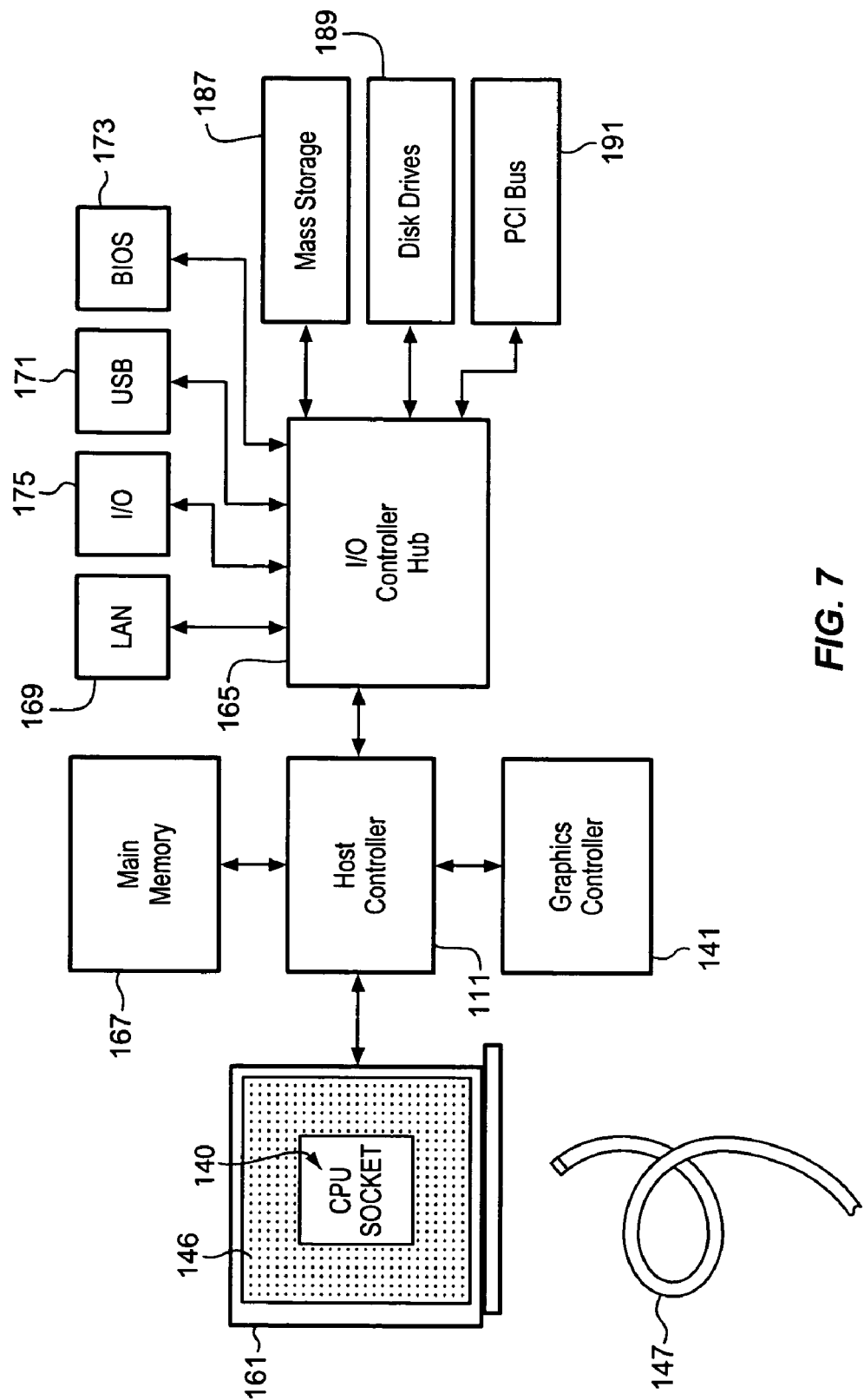
FIG. 7 is a diagram of a computer system with a socket for use with the described packages and sockets.

The packages of FIGS. 1–4 may be mounted directly to a PCB or mounted in a socket which is, in turn mounted to a PCB. A suitable socket is shown together with a package in FIG. 5. The socket 53 is shown in cross-section to reveal a cut-out, opening or recess 55 within the socket to receive the die 51 and cover or heat spreader 54 of the IC package 52. The recess is a structure that is designed to accommodate the package. As shown in FIGS. 1–4, the package extends on the die side away from the die side connectors. The recess accommodates this extension so that the die side connectors contact a landing on the socket. This landing has a connection area 56 raised above the recess to connect to the low level data signaling pins of the package. The set of data connectors may reside on one or more sides of the recess. As shown in FIG. 7, the data connectors are all around the periphery of the recess. The low level data signals are carried through the socket to a PCB (not shown) to which the socket is mounted.

The connections may take any of a variety of different types as described above for mounting the package to the PCB and the socket may be attached to the PCB in any of a variety of different ways. Sockets are commonly attached to PCBs is with reflow solder balls and SMT. Packages are commonly attached to sockets using pin grid arrays and land grid arrays, however other technologies may be used for both connections. The socket may have a lever 57, lock or cover to secure the package in place. No connections for power are shown as these may be made directly to the package. In an alternative embodiment, the socket may be provided with a connector to a power source and a corresponding connector to a land side or edge mounted power connector on the package.

Figure 5:
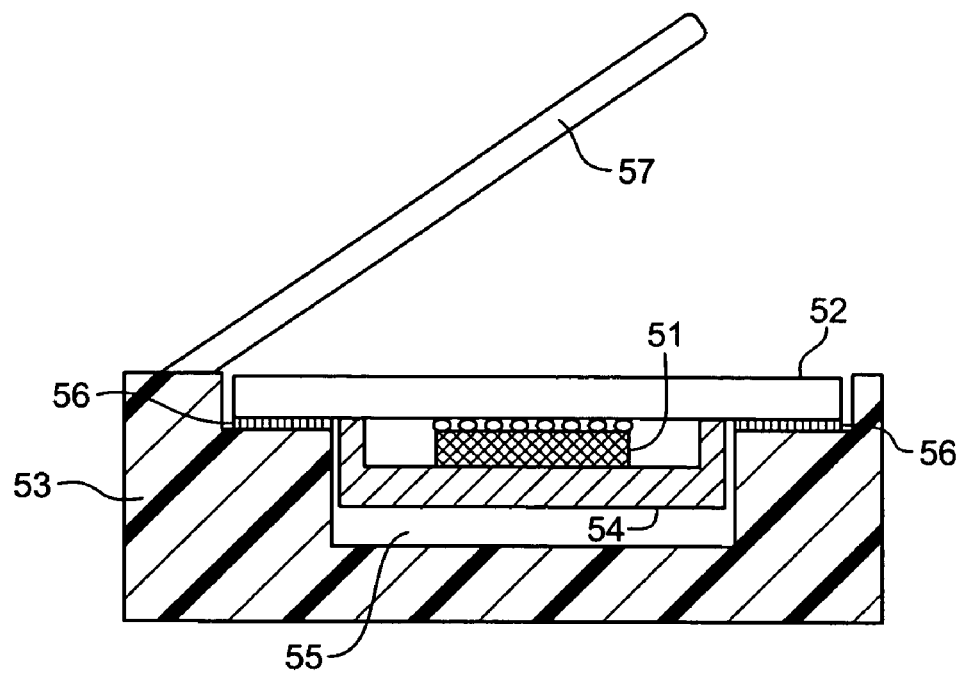
FIG. 5 is a cross-sectional diagram of an IC socket with a recess according to an embodiment of the invention.
Figure 6:
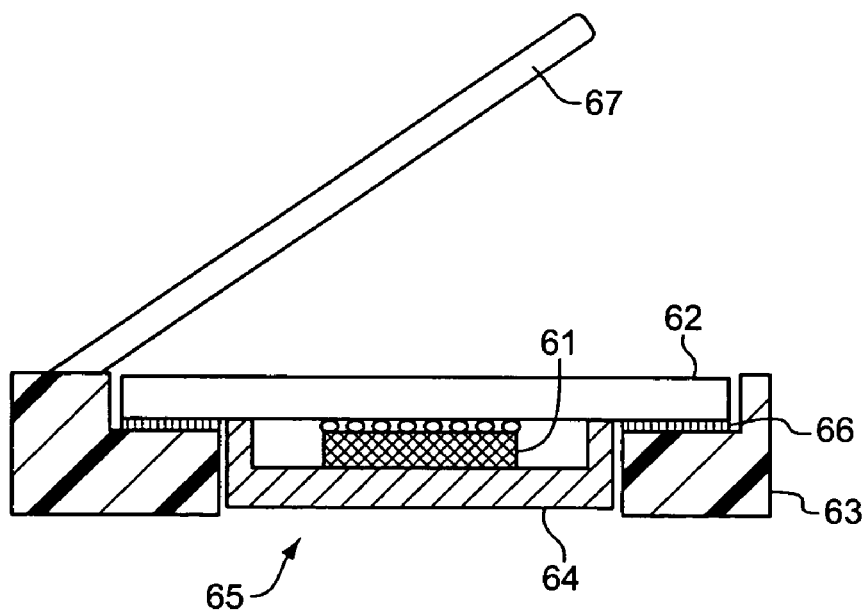
FIG. 6 is a cross-sectional diagram of an IC socket with an opening according to an embodiment of the invention.

In FIG. 6, the socket 63 has a hole 65 rather than a recess as in FIG. 5. The hole allows the die 61 and cover 64 to extend through the socket, either to rest near the PCB or to be aligned with a hole in the PCB as shown e.g. in FIG. 4. Similar connectors 66 may be provided around the periphery of the hole for the low level data signals and similar provision may be made for a power supply which may be mounted directly to the package as shown also in FIG. 4. A locking lever 67 is provided to hold the package in place, although other mechanisms may be used instead.

FIG. 7 shows a computer system suitable for use with the die and package described above. While embodiments of the present invention may be adapted for application on a great number of different ICs, the present example is described in the context of a microprocessor package supported by a chipset. In this example, the computer system may include a socket 161 for the CPU (Central Processing Unit) coupled to a chipset component 111 such as a Memory Controller Hub (MCH) chip. The MCH chip functions as part of a supporting chipset for the CPU. The MCH chip is coupled to a main memory 167, such as DRAM and to a graphics controller 141.

As shown in FIG. 5, the CPU socket 161 has a central opening 140 to receive the package cover or the IHS for the package. This opening may also extend through the motherboard as well as the socket. An opening through the motherboard allows a heat sink to be mounted to the opposite side of the motherboard as shown in FIGS. 3 and 4. As described above, the motherboard may also be adapted to receive the CPU package directly without using a socket. The sockets of FIGS. 4 and 5 are constructed to allow the package to be removed and replaced easily without soldering.

The socket also has a set of connectors 146 to couple low level signals to the CPU. In the example of FIG. 5, these low level signals are primarily coupled to the Host Controller 111. The connectors may also include power connectors or, alternatively, a separate power cable 147 may be provided to provide power to a power supply mounted to the CPU package. Such a power cable may connect to a power supply 27, 47 as shown in FIGS. 2 and 4. Any of the connectors described above may be used in any of the illustrated embodiments including pin grid arrays, ball grid arrays, land grid arrays, surface mount, solder reflow balls, elastomer with conductive columns, and more.

The MCH chip 111 is also coupled to an ICH (Input/Output controller hub) chip 165. The ICH chip offers connectivity to a wide range of different devices. Well-established conventions and protocols may be used for these connections. The connections may include a LAN (Local Area Network) port 169, a USB hub 171, and a local BIOS (Basic Input/Output System) flash memory 173. A SIO (Super Input/Output) port 175 may provide connectivity for a keyboard, a mouse, and any other human interface devices.

The ICH may also provide an IDE (Integrated Device Electronics) bus for connections to disk drives 187, 189 or other large memory devices. The mass storage may include hard disk drives and optical drives. A PCI (Peripheral Component Interconnect) or PCI-X (PCI-Express) bus 191 may be coupled to the ICH to allow a wide range of devices and ports to be coupled to the ICH. The architecture of FIG. 5 allows for a wide range of different functions and capabilities. The specific details of any implementation will depend on the particular application. The CPU, MCH, ICH, LAN port USB hub, BIOS, SIO port, IDE and PCI buses may all be carried on a single motherboard of the computer system. Any one or more peripheral devices may also be carried on the motherboard. The computer system may be adapted for use in many different applications including office productivity, communications, entertainment, music and video production or manufacturing.

Although the description of the various embodiments refers primarily to using die side connectors to attach an integrated circuit package to a socket or a PCB, the various embodiments may also be used with other types of packages, interposers, PC boards or other electronic circuit housings. The various embodiments may be used with various types of electronic assemblies, and are not to be limited to use with integrated circuit packages.

In addition, the various embodiments may be used with a number of different types of packages and packaging technologies, for example, organic or ceramic packages, and technologies such as land grid array (e.g., organic LGA), pin grid array (e.g., plastic PGA or flip chip PGA), ball grid array (e.g., μBGA, tape BGA, plastic BGA, flip chip BGA or flip chip tape BGA), and beam lead.

It is to be appreciated that a lesser or more complex semiconductor device, integrated circuit, package, socket, connector, VRM, or PCB than the examples described above may be preferred for certain implementations. Therefore, the configurations may vary from implementation to implementation depending upon numerous factors, such as price constraints, performance requirements, technological improvements, or other circumstances. Embodiments of the invention may also be applied to other types of systems that use different devices than those shown in the Figures.

In the description above, numerous specific details are set forth. However, embodiments of the invention may be practiced without these specific details. For example, well-known equivalent materials may be substituted in place of those described herein, and similarly, well-known equivalent techniques may be substituted in place of the particular techniques disclosed. In other instances, well-known circuits, structures and techniques have not been shown in detail to avoid obscuring the understanding of this description.

While the invention has been described in terms of several embodiments, those skilled in the art will recognize that the invention is not limited to the embodiments described, but may be practiced with modification and alteration within the spirit and scope of the appended claims. The description is thus to be regarded as illustrative instead of limiting.

What is claimed is:

1. An apparatus comprising:
    a package substrate having a land side and an opposite die side;
    a first set of low level signal connectors on the die side to connect to an IC to be carried by the package;
    a second set of low level signal connectors on the die side to connect to external components;
    a set of high power connectors on the land side to connect to a power supply; and
    a power supply connected to the land side of the package.

2. The apparatus of claim 1, wherein the second set of connectors connect to a printed circuit board.

3. The apparatus of claim 1, wherein the second set of signal connectors connect to a socket.

4. The apparatus of claim 1, wherein the second set of signal connectors comprise solder balls.

5. The apparatus of claim 1, wherein the second set of signal connectors comprise pins of a pin grid array.

6. The apparatus of claim 1, wherein the power supply comprises a voltage regulator module.

7. The apparatus of claim 1, further comprising a cooling subsystem coupled to the package opposite the land side of the substrate.

8. The apparatus of claim 1, further comprising a package cover to form an enclosure for the IC, wherein the first set of connectors is inside the enclosure and the second set of connectors is outside the enclosure.

9. The apparatus of claim 1, further comprising a cooling device attached to the package cover.

10. An apparatus comprising:
    a package substrate having a land side and an opposite die side;
    a first set of low level signal connectors on the die side to connect to an IC to be carried by the package;
    a second set of low level signal connectors on the die side to connect to external components;
    a cooling subsystem on the die side of the substrate to thermally couple to the IC; and
    a heat spreader thermally coupled to the IC and attached to the land side of the package substrate.

11. The apparatus of claim 10, further comprising a beat radiator thermally coupled to the heat spreader.

12. The apparatus of claim 10, further comprising a printed circuit board coupled to the set of connectors, the printed circuit board further defining an opening and wherein the cooling subsystem extends through the opening.

13. The apparatus of claim 10, further comprising a power supply mounted to the land side of the package substrate to power the IC.

14. The apparatus of claim 10, further comprising a package coupled to the package substrate to protect and carry the microprocessor, the package having:
    a set of external data connectors on a first side of the package to communicate with the first set of signal connectors; and
    a set of external power connectors on a second side of the package opposite the first side of the package to communicate with the second set of signal connectors.

15. The apparatus of claim 14, wherein the first side of the package is a die side of the package and the second side of the package is a land side of the package.

16. The apparatus of claim 14, wherein the external data connectors are on the die side of the package substrate.

17. The apparatus of claim 14, further comprising a package cover attached to the package substrate on the die side of the package and wherein the first and second sets of signal connectors are inside the package cover and the external power connectors are outside the package cover.

18. The apparatus of claim 14, further comprising a socket for carrying the package, the socket comprising:
    a structure to accommodate a die side of the package; and a set of data connectors on the periphery of the structure to carry data signals to and from the die side of the package.

19. The apparatus of claim 18, wherein the structure comprises a closed recess.

20. The apparatus of claim 19, wherein the set of data connectors are elevated from a bottom of the closed recess.

21. The apparatus of claim 18, wherein the structure comprises an opening.

22. The apparatus of claim 21, wherein the opening is adapted to align with an opening in a PCB to which the socket is to be mounted.

* * * * *

UNITED STATES PATENT AND TRADEMARK OFFICE
CERTIFICATE OF CORRECTION

PATENT NO.        : 7,235,880 B2
APPLICATION NO.   : 10/931917
DATED             : June 26, 2007
INVENTOR(S)       : Prokofiev Page 1 of 1

It is certified that error appears in the above-identified patent and that said Letters Patent is hereby corrected as shown below:

Column 8, at line 36, delete "beat" and insert --heat--.

Signed and Sealed this

Eighth Day of April, 2008

JON W. DUDAS
*Director of the United States Patent and Trademark Office*